(12) United States Patent
Yang et al.

(10) Patent No.: US 8,772,138 B2
(45) Date of Patent: Jul. 8, 2014

(54) HIGH VOLTAGE LIGHT EMITTING DIODE CHIP AND ITS MANUFACTURING METHOD

(75) Inventors: Chih-Wei Yang, Yangmei (TW); Ching-Hwa Chang Jen, Yangmei (TW)

(73) Assignee: Walsin Lihwa Corporation, Yangmei (TW)

(*) Notice: Subject to any disclaimer, the term of this patent is extended or adjusted under 35 U.S.C. 154(b) by 103 days.

(21) Appl. No.: 13/465,077

(22) Filed: May 7, 2012

(65) Prior Publication Data
US 2013/0214297 A1 Aug. 22, 2013

(30) Foreign Application Priority Data
Feb. 17, 2012 (TW) .............................. 101105225 A

(51) Int. Cl.
H01L 21/00 (2006.01)
H01L 29/18 (2006.01)

(52) U.S. Cl.
USPC ............................................. 438/463; 257/88

(58) Field of Classification Search
USPC ....... 438/33, 463, 110–113; 257/88, E21.002
See application file for complete search history.

(56) References Cited

U.S. PATENT DOCUMENTS 8,062,916 B2* 11/2011 Krames et al. .................. 438/33
8,062,960 B2* 11/2011 Kato ............................. 438/462

* cited by examiner

Primary Examiner — Calvin Lee
(74) Attorney, Agent, or Firm — Grossman, Tucker, Perreault & Pfleger, PLLC

(57) ABSTRACT

A high voltage light emitting diode chip and its manufacturing method are provided. The high voltage light emitting diode chip can be manufactured by forming a plurality of light emitting diode units on a substrate and electrically connecting the light emitting diode units, wherein a trench with a width of about 0.5 μm to about 7 μm is present between every two adjacent light emitting diode units to isolate the light emitting diode units. The procedure for manufacturing the high voltage light emitting diode chip is simple and the high voltage light emitting diode chip that is produced can exhibit satisfying luminous efficiency.

19 Claims, 8 Drawing Sheets

HIGH VOLTAGE LIGHT EMITTING DIODE CHIP AND ITS MANUFACTURING METHOD

This application claims priority to Taiwan Patent Application No. 101105225 filed on Feb. 17, 2012.

CROSS-REFERENCES TO RELATED APPLICATIONS

Not applicable.

BACKGROUND OF THE INVENTION

1. Field of the Invention

The present invention relates to a high voltage light emitting diode (HV LED) chip and its manufacturing method. In particular, the present invention relates to an HV LED chip with trenches that have a high aspect ratio and its manufacturing method, wherein each of the trenches has a width of about 0.5 μm to about 7 μm.

2. Descriptions of the Related Art

The light emitting diode (LED) is a "green lighting source" because it is both power-saving and eco-friendly. The LED has gradually replaced traditional lighting devices because of its advantages, such as a long service life, high brightness, rapid response time and small size. LED chips that were developed earlier were direct current light emitting diode (DC LED) chips, which merely comprise one LED unit and needs to be used in combination with conversion equipment such as an external transformer and rectifier. The DC LED chip not only leads to a higher energy conversion cost, but also increases the power conversion and circuit consumption. Moreover, during packaging, the volume of the circuit product and the cost for assembly, wire bonding or the like are also increased. Such a DC LED chip also has a restricted luminous efficiency and design flexibility due to its operating voltage, size limitation, current crowding phenomenon and etc., and thus, cannot completely replace traditional lighting devices.

Another LED chip is an alternating current light emitting diode (AC LED) chip, which has a plurality of LED units formed on one chip and is constructed into a circuit loop or a Wheatstone bridge to be directly used in an alternating current field. However, the AC LED chip cannot well perform the luminous efficiency of every LED unit due to such a circuit layout, and thus, has a drawback of unstable luminescence.

With the continuous research and modification in the industry, a high voltage light emitting diode (HV LED) chip has been developed recently. The HV LED chip is free of a current conversion driving component essential to the DC LED chip for light emitting, and thereby, the space can be effectively utilized. Moreover, the HV LED has a lengthened service life and enhanced design flexibility, and can prevent unstable luminescence encountered in an AC LED chip. To be compatible with existing machines, the process for manufacturing an HV LED chip is mostly based on the manufacturing currently used for AC LED chips. The process for manufacturing an HV LED chip mainly involves forming trenches in a semiconductor layer and forming an insulating layer to cover the trenches, so that the LED units (i.e., small unit grains for constituting an HV LED chip) can be isolated from each other. The existing process usually adopts an inductively coupled plasma (ICP) dry etching method to etch through a semiconductor layer to an underlying substrate to from trenches. Finally, the LED units are electrically connected by the desired circuit design.

In the above existing process, although the dry etching method can etch through the semiconductor layer and form trenches for isolation, the formed trenches are usually too broad in width. FIG. 1 is a scanning electron microscope (SEM) image of a trench fabricated using the dry etching method, wherein the trench has a width of about 15.5 μm. Such a wide trench means that a certain proportion of the light emitting area is sacrificed, and thus, the light emitting area of the LED unit is decreased and the luminous efficiency is accordingly reduced. Meanwhile, the design flexibility and minimization development of the HV LED chip are confined. Moreover, the dry etching method needs to be used in combination with the lithography process, resulting in a more complicated process. The laminating procedures are also complex and the production cost is thus increased.

In view of the above, the present invention provides a new method for manufacturing an HV LED chip. The new method does not have the disadvantages of the dry etching method and can form trenches with a relatively narrow width to increase the economical benefit of the HV LED chip.

SUMMARY OF THE INVENTION

An objective of the present invention is to provide a method for manufacturing an HV LED chip, comprising:

forming a plurality of LED units on a substrate, wherein a trench with a width of about 0.5 μm to about 7 μm is present between every two adjacent LED units to isolate the LED units; and electrically connecting the LED units.

Another objective of the present invention is to provide an HV LED chip, comprising:

a substrate; and a plurality of LED units positioned on the substrate and electrically connected to each other;

wherein a trench with a width of about 0.5 μm to about 7 μm is present between every two adjacent LED units to isolate the LED units.

Still another objective of the present invention is to provide a LED device, comprising:

a carrier plate; and a HV LED chip as described above, packaged on the carrier plate.

The detailed technology and some embodiments implemented for the present invention are described in the following paragraphs to well illustrate the above objectives, technical features and advantages of the claimed invention.

DESCRIPTION OF THE PREFERRED EMBODIMENT

The following will describe the present invention in detail by some embodiments with reference to the drawings appended. However, without departing from the spirit of the present invention, the present invention may be embodied in various embodiments and should not be limited to the embodiments described in the specification and drawings. In addition, unless it is additionally explained, the expressions "a," "the," or the like recited in the specification of the present invention (especially in the appended claims) should be regarded to comprise the singular and the plural forms. Furthermore, for clarity, the size of each element and each area may be exaggerated in the attached drawings, and the components not directly relevant to the present invention are omitted.

Figure 1:
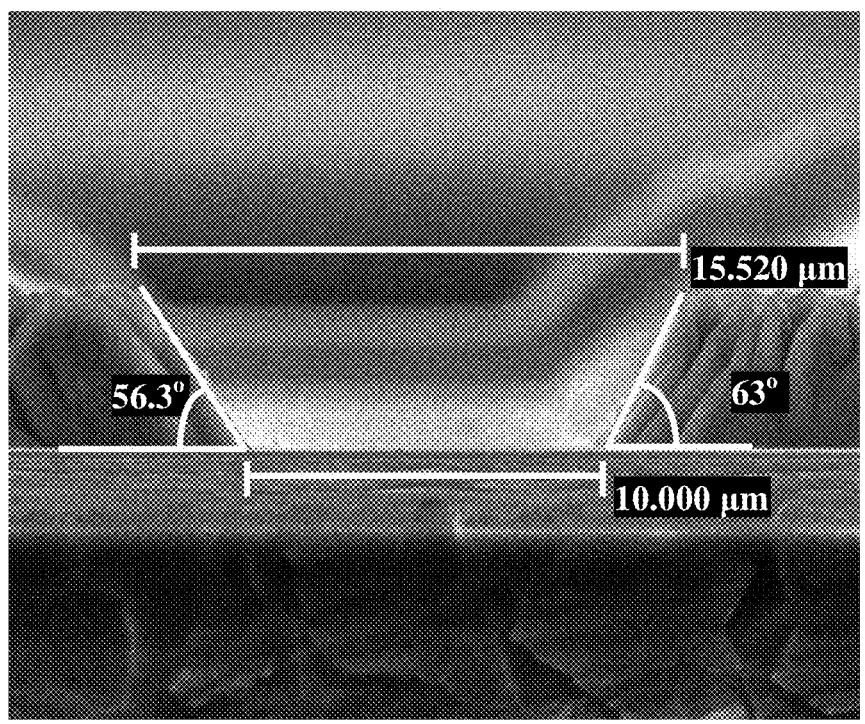
FIG. 1 is an SEM image of a trench fabricated by the dry etching method.
Figure 2:
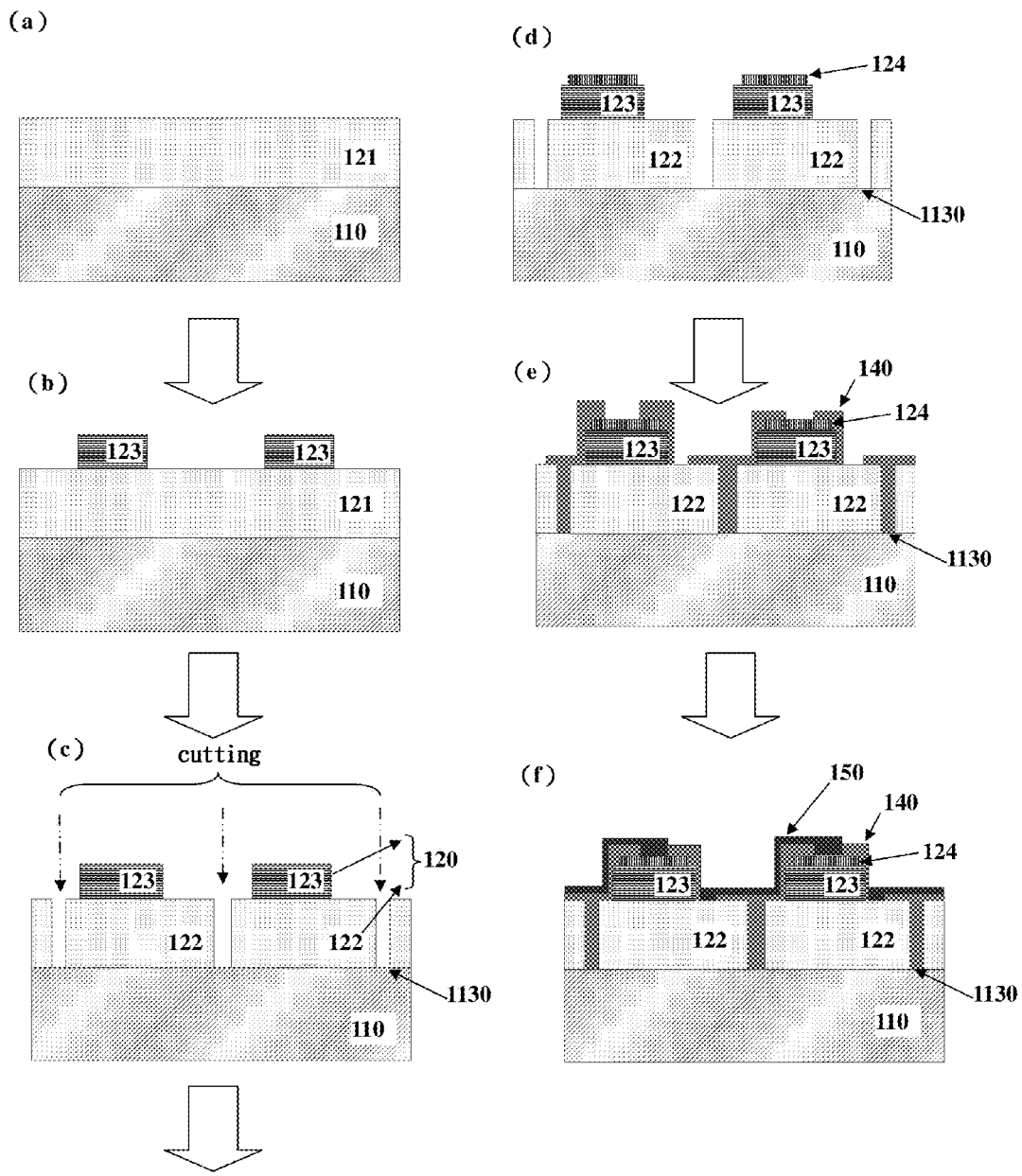
FIG. 2 is a flow diagram of one embodiment of the method according to the present invention.

The method for manufacturing an HV LED chip according to the present invention comprises forming a plurality of LED units on a substrate and electrically connecting the LED units. Hereinafter, one embodiment of the method for manufacturing an LED chip according to the present invention is described with reference to FIG. 2. As shown in FIG. 2, the method for manufacturing an HV LED chip of the present invention can comprise the following steps:

forming a first semiconductor layer 121 on a substrate 110 (step (a));

forming a plurality of second semiconductor structures 123 on at least a portion of the first semiconductor layer 121 in the desired pattern (step (b));

cutting the exposed first semiconductor layer 121 by the desired pattern to form a plurality of first semiconductor structures 122 (step (c)) such that (1) the first semiconductor layer 121 is converted to a plurality of first semiconductor structures 122 corresponding to the second semiconductor structures 123, (2) each coupled first semiconductor structure 122 and second semiconductor structure 123 constitutes a LED unit 120, and (3) a trench 1130 is present between every two adjacent LED units 120 to isolate the LED units 120 to avoid any short-current therebetween;

forming a conducting structure 124 on each second semiconductor structure 123 as the joint for the electrical connection (step (d));

forming an insulating structure 140 on the periphery of each LED unit 120 to protect the LED units 120 and expose a portion of the conducting structures 124 and the first semiconductor structures 122 (step (e)); and forming electrically connecting structures 150 by a predetermined circuit layout to electrically connect the LED units 120 (step (f)).

According to the disclosure of the present invention, persons with ordinary skill in the art can use any suitable materials as components involved in the present invention based on the operating mechanism of each component, and thus, carry out the method of the present invention. For example, the substrate 110 can be composed of any transparent semiconductor materials, preferably $Al_2O_3$ (sapphire). The materials of the first semiconductor structure 122 and the second semiconductor structure 123 depend on the desired light emitting wavelength, and generally, can be respectively selected from a group consisting of GaN, InGaN, GaAs and combinations thereof. The first semiconductor structure 122 and the second semiconductor structure 123 are different from each other in conducting type, i.e., one of them is a p-type semiconductor structure and the other is an n-type semiconductor structure. The conducting structure 124 usually uses any conducting material capable of bonding with the second semiconductor structure 123, preferably indium tin oxide (ITO) with better transparency and conductivity. The insulating structure 140 can be composed of any suitable insulating material with a high optical transparency such as $SiO_2$, SiN or $Al_2O_3$. The electrically connecting structure 150 can use any suitable conducting material, mostly a metallic material, such as Au, Ag, Cu, Ti, Al, Cr or Pt.

As mentioned above, the method of the present invention comprises a cutting step for forming a plurality of first semiconductor structures (see 122 in FIG. 2) and trenches for isolating the LED units (see 1130 in FIG. 2). The width of the trench should be as narrow as possible to avoid sacrificing or wasting the light emitting area, thus, improving the luminous efficiency of the resulting HV LED chip and facilitating the minimization development of the device. According to the present invention, the width of the trench is substantially less than about 10 μm, preferably about 0.5 μm to about 7 μm, more preferably about 0.5 μm to about 5 μm. The depth of the trench should reach a level to ensure that every LED unit 120 is isolated as shown in FIG. 2. In other words, the depth of the trench should be equal to or greater than the thickness of the first semiconductor structure 122, preferably greater than the thickness of the first semiconductor structure 122 by about 10 μm to about 15 μm.

Figure 3:
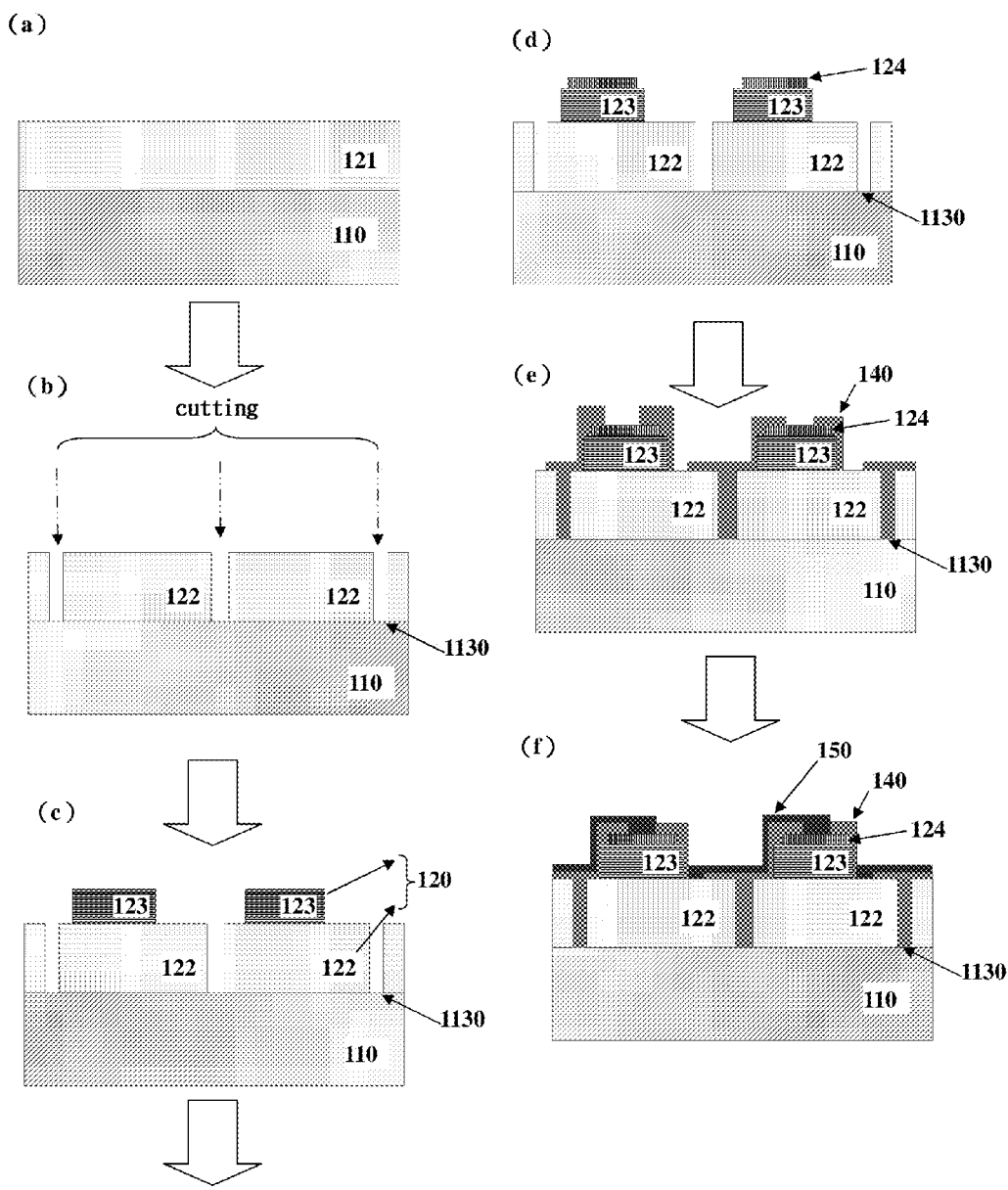
FIG. 3 is a flow diagram of another embodiment of the method according to the present invention.
Figure 4:
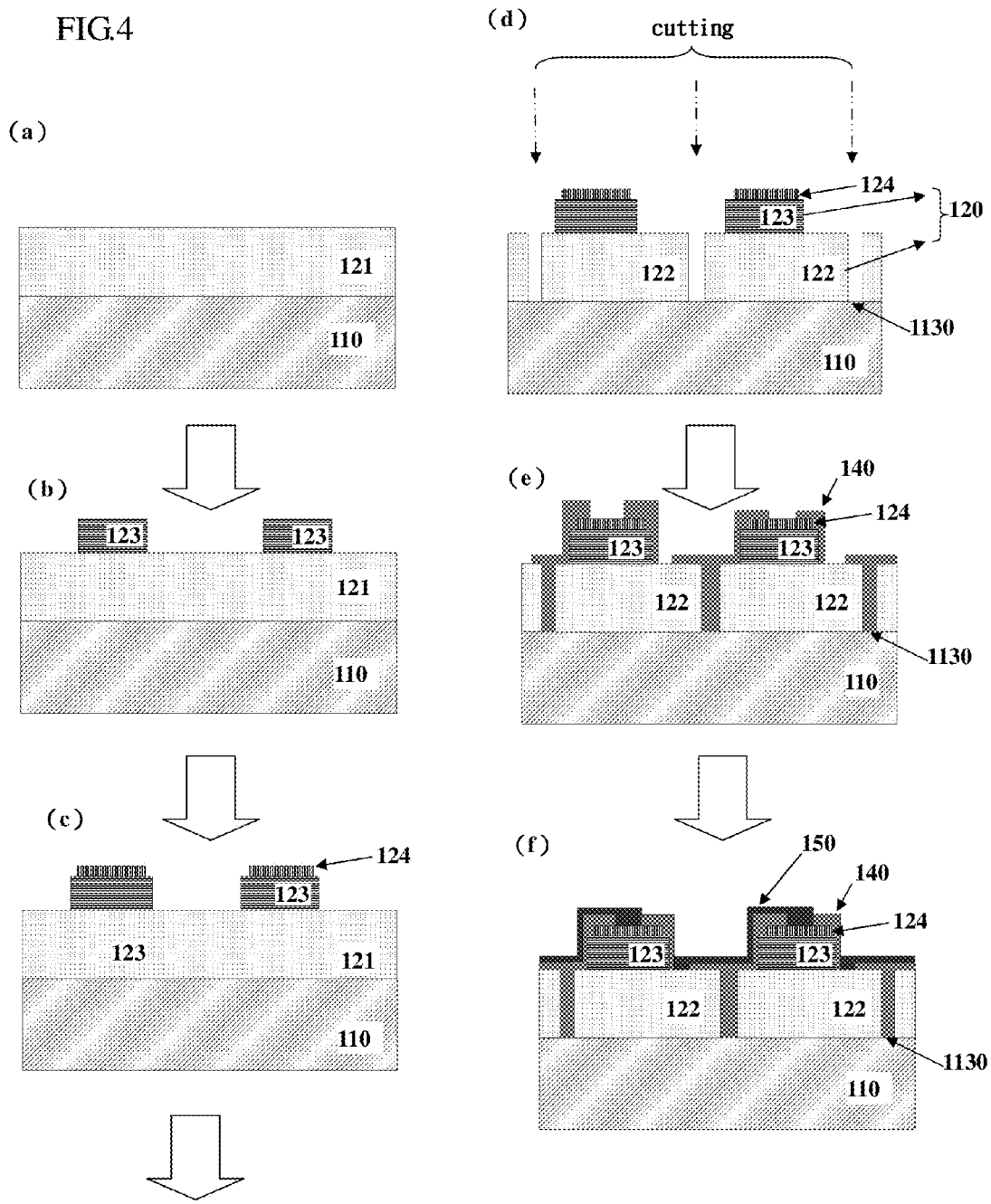
FIG. 4 is a flow diagram of still another embodiment of the method according to the present invention.

According to the method of the present invention, the cutting step can be carried out before or after other steps, in addition to before the formation of the conducting structure 124. For example, as shown in FIG. 3, the cutting step can be carried out before the formation of the second semiconductor structure 123; that is, after forming the first semiconductor layer 121 on the substrate 110 (step (a)), the first semiconductor layer 121 is directly cut by a predetermined pattern to form a plurality of first semiconductor structures 122 and trenches 1130 (step (b)). A plurality of second semiconductor structures 123 are subsequently formed on the first semiconductor structures 122 (step (c)). Alternatively, as shown in FIG. 4, the cutting step can be carried out after the formation of the conducting structure 124; that is, after forming the first semiconductor layer 121 on the substrate 110 (step (a)), a plurality of second semiconductor structures 123 (step (b)) and a plurality of conducting structures 124 (step (c)), the exposed first semiconductor layer 121 is then cut to form a plurality of the first semiconductor structures 122 and trenches 1130 (step (d)). Persons with ordinary skill in the art can adjust the sequence of the cutting step depending on the requirement of the process design after reviewing the disclosure of the present invention.

Figure 5A:
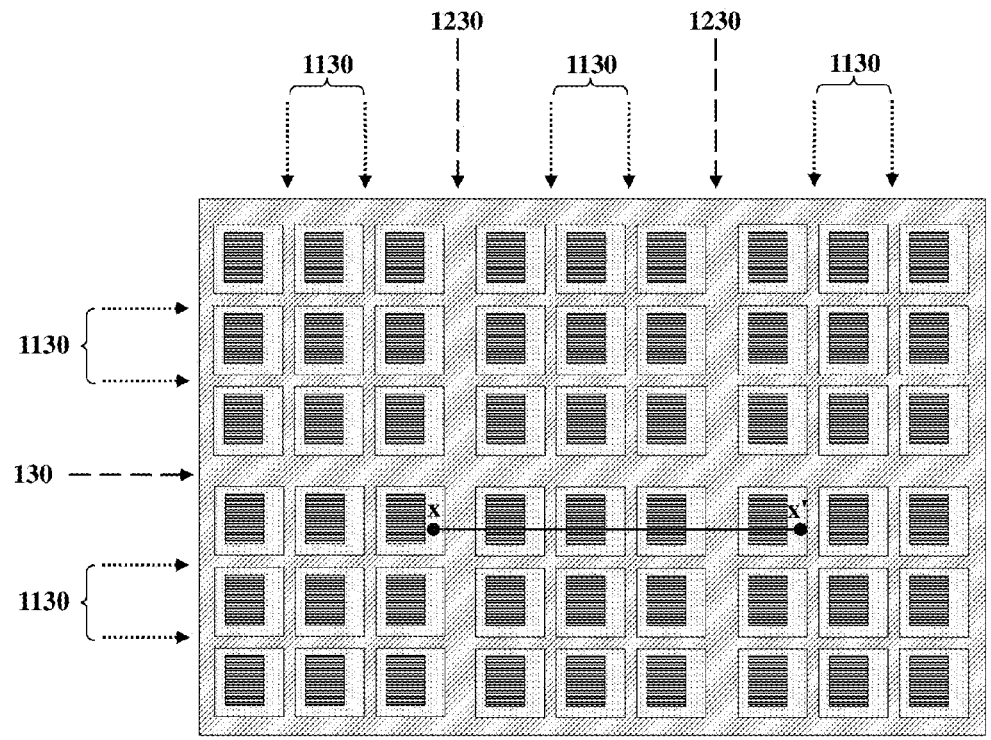
FIG. 5A is a top view of trenches and splitting trenches formed according to the method of the present invention.
Figure 5B:
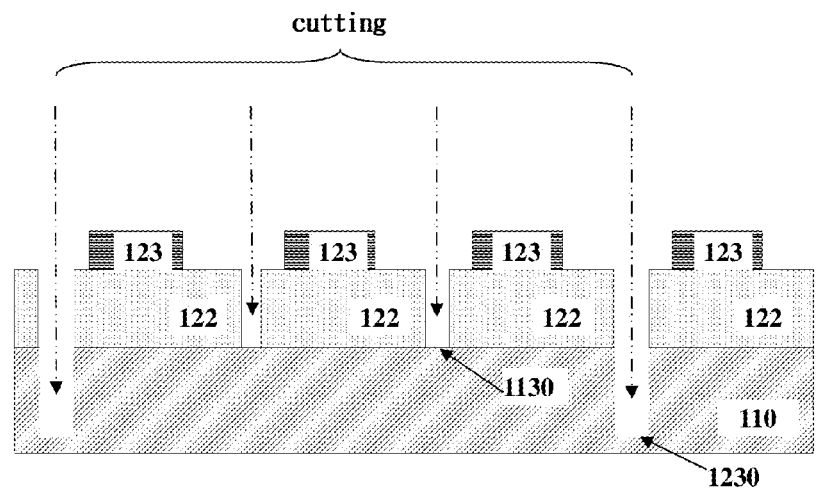
FIG. 5B is a cross-sectional view along the XX' line in FIG. 5A.

In the method of the present invention, the cutting step not only provides the trenches for isolating the LED units (see 1130 in FIGS. 2 to 4), but can also provide splitting trenches as desired. The splitting trenches are used for the chip cutting operation that splits the substrate in a subsequent process (for example, after thinning the substrate) to obtain a plurality of HV LED chips for individual use. The splitting trenches are generally extended into the substrate to a depth of greater than about 0.5 μm or about 1 μm, preferably into the substrate to a depth of about 5 μm to about 10 μm. The width of the splitting trench can be equal to the isolating trench in consideration of the whole manufacturing process, or can be optionally adjusted. For the case shown in FIG. 2 (in which the cutting step is carried out before the formation of the conducting structures 124), FIG. 5A shows the top view of the cutting step for forming trenches 1130 and splitting trenches 1230 according to the present invention, and FIG. 5B shows the cross-sectional view along the XX' line in FIG. 5A. As shown in FIG. 5B, the depth of the trenches 1130 is equal to the thickness of the first semiconductor structures 122, and the depth of the splitting trenches 1230 is deeper than that of the trench 1130. After the formation of the trenches 1130 and splitting trenches 1320, the subsequent processes (such as forming the conducting structures, forming the insulating structure and conducting the electrical connections) are then carried out to form a plurality of HV LED chips on the substrate 110 (the six chips as shown in FIG. 5A), followed by splitting the substrate 110 to obtain a plurality of separated HV LED chips via the splitting trenches 1230. Depending on the requirements of various processes, all trenches can be formed with an equal depth and the electrical connections can be subsequently applied by the circuit design, followed by deepening the trenches between two adjacent HV LED chips defined by a predetermined pattern to form the desired splitting trenches.

Figure 6A:
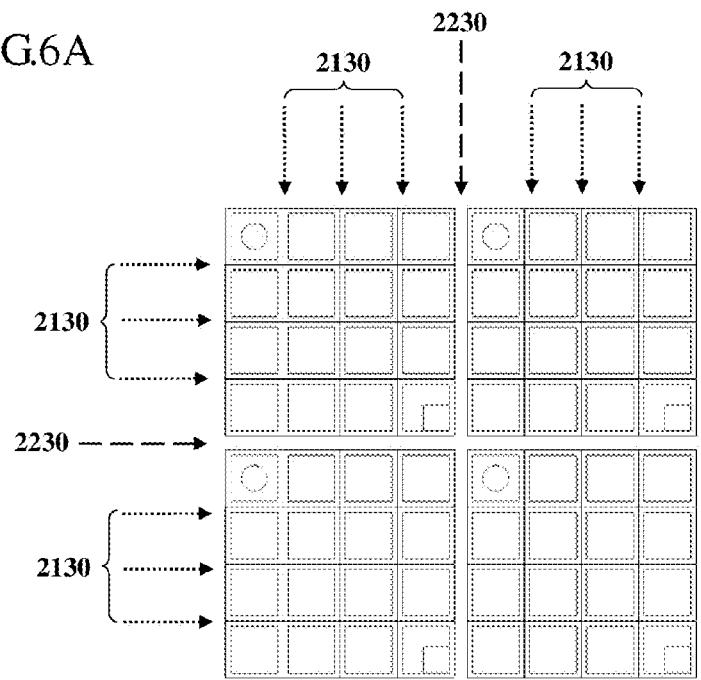
FIGS. 6A and 6B are schematic diagrams of the cutting patterns according to the method of the present invention.
Figure 6B:
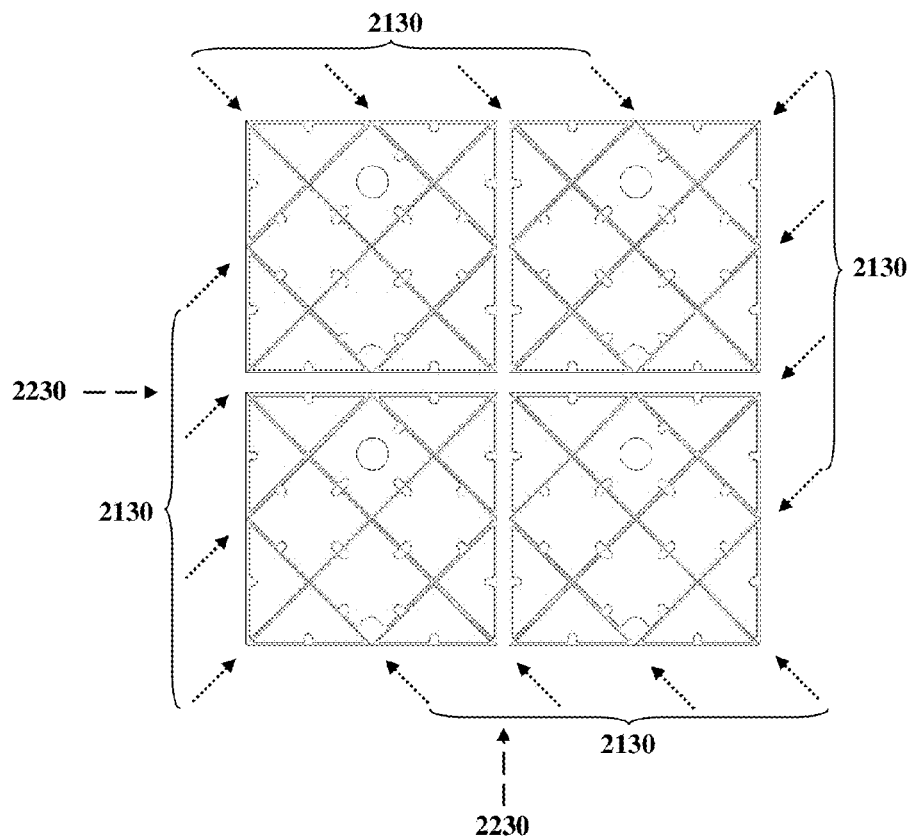

According to one preferred embodiment of the method of the present invention, the trenches are formed via laser cutting. The laser cutting provides a more satisfying trench width, which is narrowed to a level of about 0.5 µm to about 1.5 µm. Furthermore, as compared with the trenches cutting by the traditional dry etching method (in which lithography process is necessary), laser cutting is more convenient in operation, which can easily provide the desired cutting pattern and thus, raises the design flexibility of HV LED chips and brings about a higher economical benefit. For example, the cutting pattern as shown in FIGS. 6A and 6B can be provided via the laser cutting, wherein the numeral number 2130 refers to the isolating trench and the numeral number 2230 refers to the splitting trench.

Figure 7:
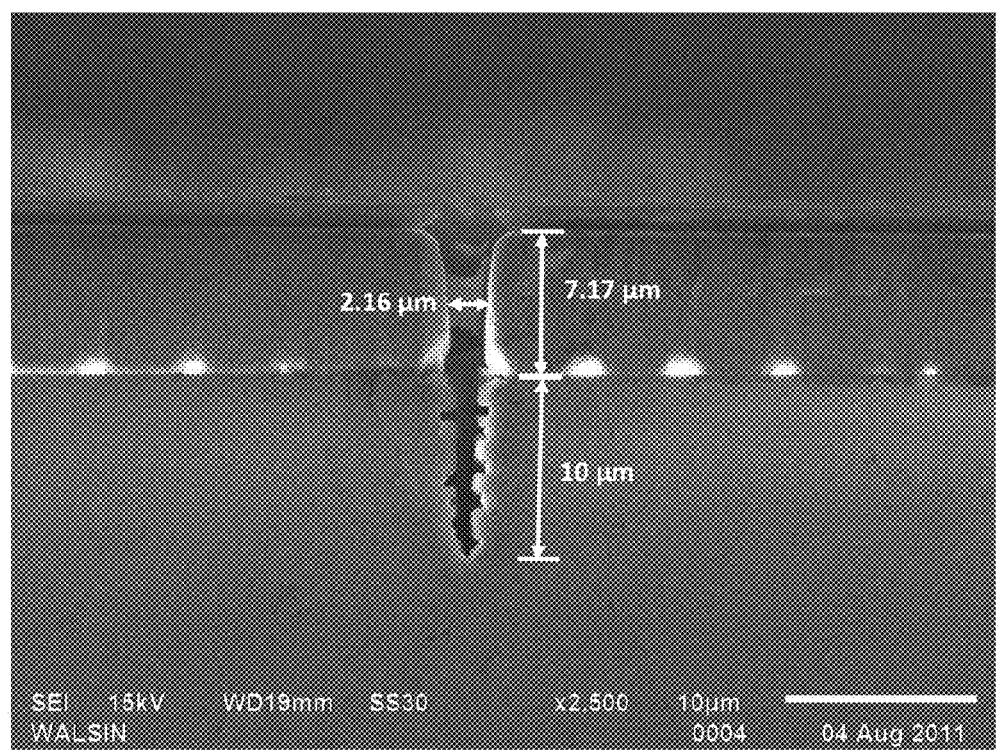
FIG. 7 is an SEM image of a trench fabricated by one embodiment of the method according to the present invention using laser cutting.

In the embodiment using laser cutting, the width and depth of the trenches, including the isolating trenches and splitting trenches mentioned above, can be controlled by adjusting the laser operating conditions. Persons with ordinary skill in the art can set the suitable operating conditions, such as the laser wavelength, operating power, cutting rate and width of laser beam, to provide the desired cutting effect based on the used machine in view of the disclosure of the present invention. FIG. 7 is an SEM image of a trench obtained after laser cutting in the following embodiment, wherein the width of the trench is narrowed to about 2 nm and its total depth is about 17 µm, including the thickness of the first semiconductor structure (about 7 µm) and the portion extending into the substrate (about 5 µm to about 10 µm).

After cutting the first semiconductor layer to form the trenches, the method of the present invention can further comprise a step for washing trenches to remove the residuals generated during the cutting and etch away from the damaged cut surface. Generally, the procedure for washing trenches can be performed by the wet etching technology (such as using solutions of hot phosphoric acid, sulfuric acid, potassium hydroxide, hydrofluoric acid or the like). The concentration of the etching solution and the washing time should be appropriately controlled to prevent the trenches from being adversely widened.

In some embodiments of the present invention, fluorescent substances, light-guiding particles or light-scattering particles can be optionally introduced into the insulating structure to change the light emitting wavelength of the LED and improve the light extraction efficiency. The fluorescent substance is selected depending on the luminous color of the LED unit according to the desired luminous color. For example, the fluorescent substance can be selected from, but is not limited to, the commercial phosphors, such as yttrium aluminum garnet (YAG) phosphor, zinc sulfide phosphor or silicate phosphor. The light-guiding particle or light-scattering particle can be selected, but is not limited to, $TiO_2$, $SiO_2$, $ZrO_2$ and combinations thereof.

The method of the present invention further comprises a step for forming the electrically connecting structures to electrically connect the LED units. The connection can be in series or in series-and-parallel connection and also in a circuit loop or Wheatstone bridge connection. Finally, as shown in FIG. 8, the external conducting wires 160 are formed according to the entire layout and then the chip cutting operation is performed via the splitting trenches 1230 to obtain a plurality of individual HV LED chips 100.

The present invention also provides an HV LED chip, which can be manufactured by the method as mentioned above. The HV LED chip comprises a substrate and a plurality of LED units. The LED units are positioned on the substrate and electrically connected to each other. A trench with a width of about 0.5 µm to about 7 µm, preferably about 0.5 µm to about 5 µm, is present between every two adjacent LED units.

Figure 8:
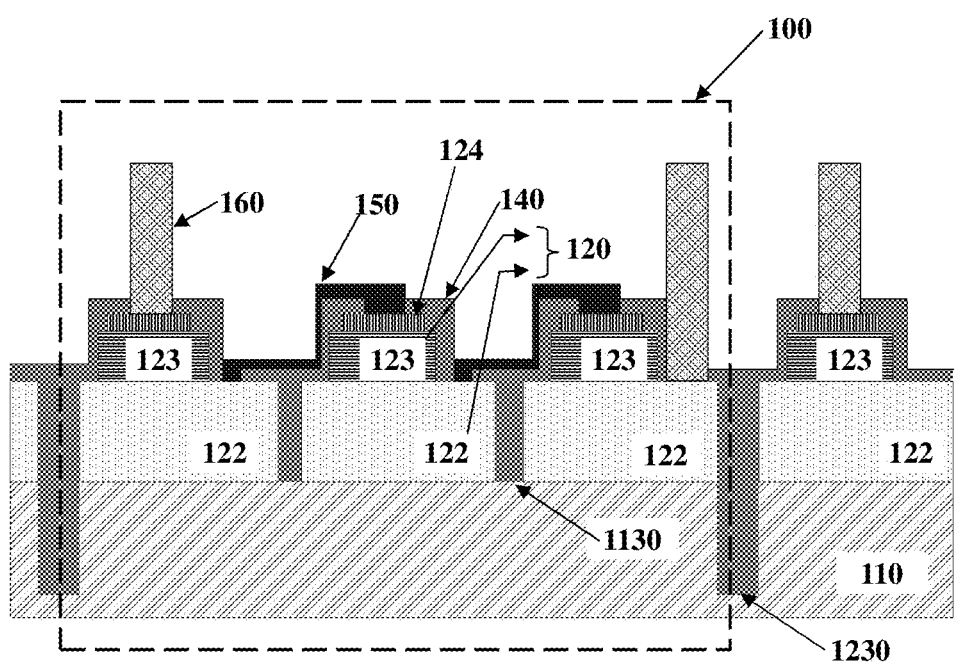
FIG. 8 is a schematic diagram of one embodiment of the HV LED chip according to the present invention.

FIG. 8 shows one embodiment of the HV LED chip 100 of the present invention before splitting. The HV LED chip 100 comprises a substrate 110 and a plurality of LED units 120, and each LED unit 120 comprises a first semiconductor structure 122 positioned on the substrate 110 and a second semiconductor structure 123 positioned on the first semiconductor structure 122. The HV LED chip 100 further comprises conducting structures 124 positioned on the second semiconductor structures 123 and an insulating structure 140 for protecting the LED units 120. The LED units 120 are electrically connected to each other via the conducting structures 124 and the electrically connecting structures 150. Furthermore, in the chip according to the present invention, the depth of the trench 1130 is equal to or greater than the thickness of the first semiconductor structure 122 (as shown in FIG. 8), and preferably greater than the thickness of the first semiconductor structure 122 by about 10 µm to about 15 µm.

The materials of the substrate, first semiconductor structure, second semiconductor structure, conducting structure, insulating structure, electrically connecting structure and other optional components used in the HV LED chip of the present invention can be selected according to the conditions for the method as mentioned above, which is not further described herein.

The present invention also provides a light emitting device, comprising a carrier plate and an HV LED chip as described above. The HV LED chip of the present invention can be packaged on the carrier plate by any suitable means, such as adhesion, flip-chip or chip-on-board (COB), to obtain a LED device. The carrier plate is not particularly limited by its material, and can be a thermal-electric separated substrate or thermal-electric integrated substrate, such as a silicon semiconductor substrate, aluminum nitride semiconductor substrate or other metallic substrate (like copper-tungsten substrate). Optionally, the light emitting device of the present invention can further comprise a reflective layer to improve the light extraction efficiency.

The present invention will be further illustrated by the embodiment hereinafter. The embodiment is intended for illustration, but not for limiting the scope of the present invention.

An HV LED chip is manufactured according to the flow diagram in FIG. 2. First, an n-type GaN layer with a thickness of about 5 µm to about 8 µm was formed on an $Al_2O_3$ substrate. A plurality of p-type GaN mesas with a thickness of about 1 µm to about 3 µm were then formed on the n-type GaN layer via a lithography process, wherein a space with a width of about 20 μm to about 50 μm was present between every two adjacent p-type GaN mesas. Subsequently, a laser beam with a width of about 1 μm to about 3 μm (wavelength: about 355 nm; power: about 0.5 mW/90 kHz to about 1.45 mW/90 kHz) was irradiated to the spaces and moved at a rate of about 120 mm/sec. The n-type GaN layer was thus cut into a plurality of n-type GaN mesas. The structure of the resulting trench was as shown in FIG. 7.

Instantly, the substrate was washed by a phosphoric acid-sulfuric acid etching solution at about 250° C. to about 300° C. for about 200 sec to about 2000 sec, thus, forming trenches with a width of about 3 μm to about 5 μm present between every two adjacent n-type GaN mesas. Next, ITO conducting layers with a thickness of about 0.05 μm to about 0.5 μm were formed on each p-type GaN mesa, and insulating structures (such as nitrogen oxide) were then formed by plasma-enhanced chemical vapor deposition (PECVD) or other processes (such as coating), followed by electrically connecting the LED units in series connection via a metallic material and forming external conducting wires. Finally, the substrate was split to obtain individual HV LED chips.

From the above, the method of the present invention indeed can obtain the trenches with a narrow width for completely separating the n-type GaN mesas and thus, preventing short-circuiting between the LED units. As compared to the traditional dry etching method, the method of the present invention can significantly reduce the width of the trenches and correspondingly increase the light emitting area of the LED, thus improving the entire luminous efficiency.

The above embodiment is used to illustrate the principle and efficacy of the present invention and show the inventive features thereof, but not to limit the scope of protection of the present invention. People skilled in this field may proceed with a variety of modifications and replacements based on the disclosures and suggestions of the invention as described without departing from the technical principle and spirit thereof. Therefore, the scope of protection of the present invention is as that defined in the claims as appended.

What is claimed is:

1. A method for manufacturing a high voltage light emitting diode chip, comprising:
   forming a plurality of light emitting diode units on a substrate, wherein a trench with a width of about 0.5 μm to about 7 μm is present between every two adjacent light emitting diode units to isolate the light emitting diode units;
   forming an insulating structure on the periphery of each light emitting diode unit; and
   electrically connecting the light emitting diode units.

2. The method of claim 1, wherein the trench has the width of about 0.5 μm to about 5 μm.

3. The method of claim 1, wherein the trench is formed by a laser-cutting step.

4. The method of claim 3, which further comprises a trench-washing step after the laser-cutting step.

5. A high voltage light emitting diode chip, comprising:
   a substrate;
   a plurality of light emitting diode units positioned on the substrate and electrically connected to each other;
   a trench formed between the every two adjacent light emitting diode units; and
   an insulating structure formed in the trench,
   wherein the trench has a width of about 0.5 μm to about 7 μm.

6. A light emitting diode device, comprising:
   a carrier plate; and
   a high voltage light emitting diode chip of claim 5, packaged on the carrier plate.

7. The high voltage light emitting diode chip of claim 5, wherein the trench has the width of about 0.5 μm to about 5 μm.

8. A light emitting diode device, comprising:
   a carrier plate; and
   a high voltage light emitting diode chip of claim 7, packaged on the carrier plate.

9. The high voltage light emitting diode chip of claim 5, wherein each light emitting diode unit comprises:
   a first semiconductor structure positioned on the substrate; and
   a second semiconductor structure positioned on the first semiconductor structure;
      wherein the trench has a depth being equal to or greater than a thickness of the first semiconductor structure.

10. The high voltage light emitting diode chip of claim 9, wherein each light emitting diode unit further comprises a conducting structure positioned on the second semiconductor structure as a joint for the electrical connection.

11. A light emitting diode device, comprising:
    a carrier plate; and
    a high voltage light emitting diode chip of claim 9, packaged on the carrier plate.

12. The high voltage light emitting diode chip of claim 9, wherein the depth of the trench is greater than the thickness of the first semiconductor structure by about 10 μm to about 15 μm.

13. A light emitting diode device, comprising:
    a carrier plate; and
    a high voltage light emitting diode chip of claim 12, packaged on the carrier plate.

14. The high voltage light emitting diode chip of claim 9, wherein the materials of the first semiconductor structure and the second semiconductor structure are independently selected from the group consisting of GaN, InGaN, GaAs and combinations thereof.

15. A light emitting diode device, comprising:
    a carrier plate; and
    a high voltage light emitting diode chip of claim 14, packaged on the carrier plate.

16. The high voltage light emitting diode chip of claim 9, wherein the first semiconductor structure is a p-type semiconductor structure, and the second semiconductor structure is an n-type semiconductor structure.

17. A light emitting diode device, comprising:
    a carrier plate; and
    a high voltage light emitting diode chip of claim 16, packaged on the carrier plate.

18. The high voltage light emitting diode chip of claim 9, wherein the first semiconductor structure is an n-type semiconductor structure, and the second semiconductor structure is a p-type semiconductor structure.

19. A light emitting diode device, comprising:
    a carrier plate; and
    a high voltage light emitting diode chip of claim 18, packaged on the carrier plate.

* * * * *